United States Patent
Bae et al.

(10) Patent No.: US 6,426,277 B1
(45) Date of Patent: Jul. 30, 2002

(54) METHODS AND A DEVICE FOR HEAT TREATING A SEMICONDUCTOR WAFER HAVING DIFFERENT KINDS OF IMPURITIES

(75) Inventors: Dong-Joo Bae; Kang-Wan Lee, both of Seoul (KR)

(73) Assignees: Anam Semiconductor Inc., Seoul (KR); Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/421,454

(22) Filed: Oct. 19, 1999

(30) Foreign Application Priority Data

Oct. 19, 1998 (KR) .............................................. 98-43620

(51) Int. Cl.⁷ .......................................... H01L 21/265
(52) U.S. Cl. ........................ 438/522; 438/530; 438/308; 257/69; 257/369
(58) Field of Search ................................ 438/522, 530, 438/308, 795, 231, 232, 275; 257/66, 69, 336, 344, 369

(56) References Cited

U.S. PATENT DOCUMENTS 5,837,572 A * 11/1998 Gardner et al. ............. 438/199
6,054,354 A * 4/2000 Nowak et al. ............... 438/275
6,165,876 A * 12/2000 Yamazaki et al. .......... 438/517

FOREIGN PATENT DOCUMENTS

JP          1276621       11/1989       ......... H01L/21/268

* cited by examiner

Primary Examiner—Wael Fabossy, Jr.
Assistant Examiner—Hsien Ming Lee
(74) Attorney, Agent, or Firm—Skjerven Morrill LLP

(57) ABSTRACT

A method and a device for locally heating a semiconductor wafer having a first region of a first impurity and a second region of a second impurity having a diffusion rate different from that of the first impurity. A field oxide layer, a P well and an N well, gate oxide layers, gate electrodes, an N-type region and a P-type region are formed in sequence on or in a silicon wafer. The wafer is placed into a chamber. Then, a mask, which has a pattern for blocking the radiation from the heat source to the N well of the wafer, is positioned between the heat source and the wafer. The heat source emits radiation for heating the wafer, thereby the donor-type dopant atoms in the N-type region are diffused with a diffusion depth of d2 to form an electrically active region, but the acceptor-type dopant atoms in the P-type region are not diffused. After this step, a mask, which has a pattern for blocking the radiation from the heat source to the P well of the wafer, is positioned between the heat source and the wafer. The heat source emits radiation for heating the wafer, thereby the acceptor-type dopant atoms in the P-type region are diffused with a diffusion depth of d2 to form an electrically active region, but the donor-type dopant atoms in the N-type region are not diffused.

19 Claims, 4 Drawing Sheets

METHODS AND A DEVICE FOR HEAT TREATING A SEMICONDUCTOR WAFER HAVING DIFFERENT KINDS OF IMPURITIES

BACKGROUND OF THE INVENTION

1. Field Of The Invention

The present invention relates to methods and a device for heating a semiconductor wafer, and more particularly to methods and a device for locally heating a semiconductor wafer having different kinds of impurities.

2. Background of the Invention

A semiconductor device such as a transistor in a semiconductor wafer commonly includes N-type or P-type impurity regions that are formed by implanting impurities into the wafer and heating the wafer to diffuse the impurities. Donor-type dopants, such as phosphorus, are used to form the N-type regions, and acceptor-type dopants, such as boron, are used to form the P-type regions. The electrical characteristics of the semiconductor device are dependent upon the dimensions, such as the depth, the length and the width of the impurity regions.

The dimensions of an impurity region are significantly affected by heat treatment of the wafer as well as the implant concentration and the implant energy of the impurities. For example, high heating temperature or long heating time yields an impurity region having a large area and a deep depth.

One of the conventional methods of heat treatment of semiconductor wafers uses an annealing furnace. The impurities are activated in a temperature ranging from 800° C. and 1,000° C. In the furnace heating method, the desired heating temperature is reached in a heating time of about 30 minutes.

Another example of the conventional heat treatment is called rapid thermal processing (RTP). RTP is typically performed with a tungsten-halogen lamp and a reflecting plate. The activation temperatures can be reached in less than one minute, which is far more quickly than the furnace heating method.

In the above described conventional methods, the wafer is heated as a whole. Since different impurities have different diffusion rates, the regions of different impurities come to have different dimensions, and it is difficult to obtain the precise dimensions required for the respective regions.

Although control of the implantation depth and concentration of the impurities may be used to provide the required dimensions of an impurity region, it is well recognized that implantation depth cannot be easily controlled especially for the shallow junctions, and lateral diffusion also cannot be easily controlled.

SUMMARY OF THE INVENTION

The present invention provides methods and a device for heat treating a semiconductor wafer such that precise dimensions of a plurality of impurity regions for a semiconductor device can be obtained. According to an embodiment of the present invention, a heat treating method for a semiconductor wafer having a first region containing a first impurity and a second region containing a second impurity having a diffusion rate different from that of the first impurity includes heating the first region to diffuse at least the first impurity and heating only the second region to diffuse the second impurity.

The present invention also provides a heat treating method for a semiconductor wafer having a first region of a first impurity and a second region of a second impurity having a diffusion rate different from that of the first impurity. The method includes directing radiation at the wafer, blocking the radiation directed at the first region to prevent the first region from heating, and blocking the radiation directed at the second region to prevent the second region from heating.

The present invention also provides that a local heating method for a semiconductor wafer having a first region of a first impurity and a second region of a second impurity having a diffusion rate different from that of the first impurity. The method includes directing a first radiation dose at the wafer to heat the first and the second regions, directing a second radiation dose at the wafer, and blocking a portion of the second radiation dose that is directed at the first region to prevent diffusion of the first impurity.

The present invention also provides that a device for heat treating a semiconductor wafer having different types of impurities with different diffusion rates. The device includes a heat source that directs radiation at the wafer, and a blocker that blocks the radiation and excludes the radiation from at least a portion of the wafer.

The present invention is better understood upon consideration of the detailed description below and the accompanying drawings.

BRIEF DESCRIPTION OF THE DRAWINGS

The accompanying drawings, which are incorporated in and constitute a part of the specification, illustrate an embodiment of the invention, and, together with the following description, serve to explain the principles of the invention.

DETAILED DESCRIPTION

An exemplary embodiment of the present invention will now be described in detail with reference to the accompanying drawings.

Figure 1:
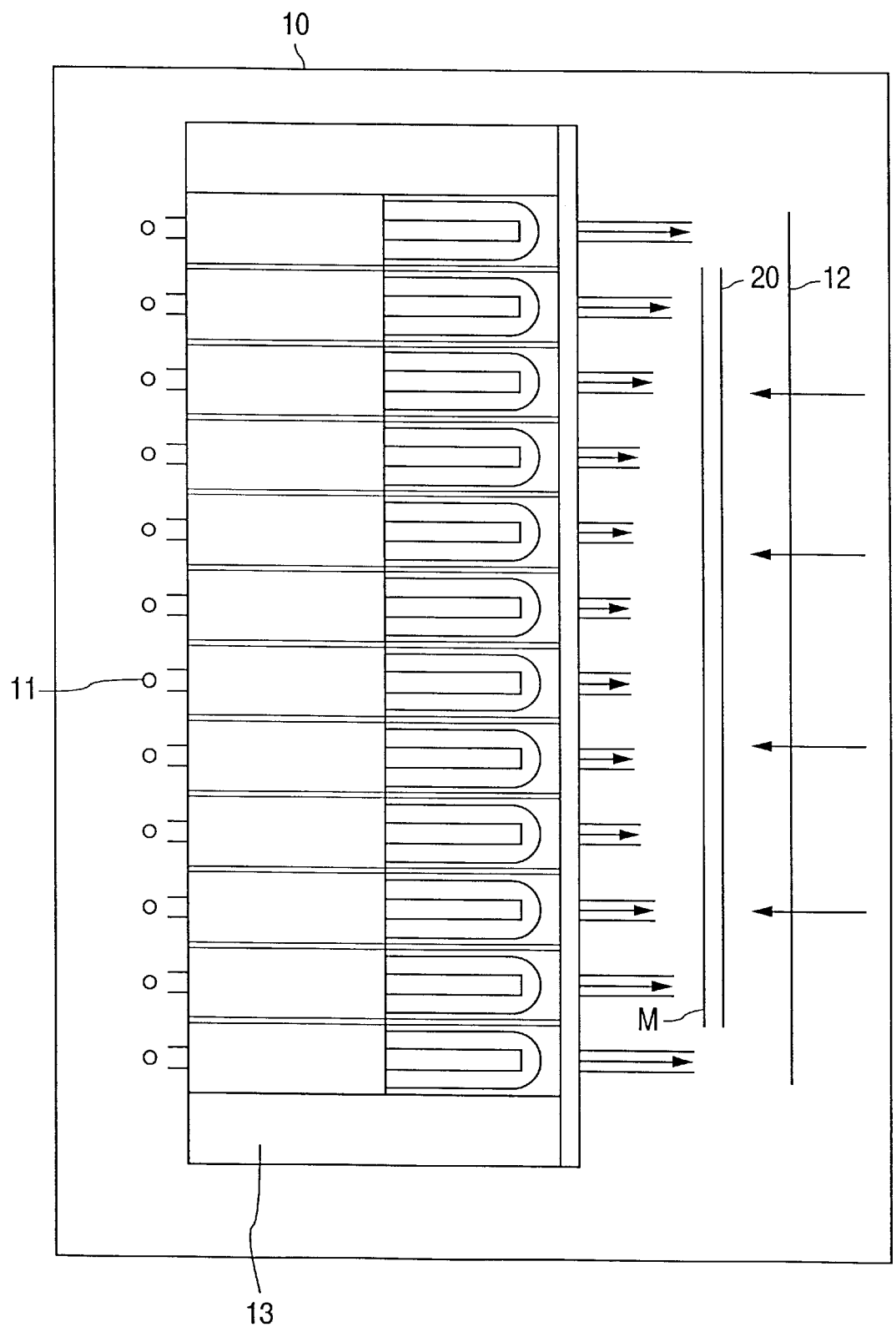
FIG. 1 is a schematic diagram of a device for rapid thermal processing according to an embodiment of the present invention.

FIG. 1 is a schematic cross-sectional view of a device for rapid thermal processing according to an embodiment of the present invention. Referring to FIG. 1, the device for performing rapid thermal processing (RTP) of a silicon wafer 20 includes a chamber 10. The chamber 10, which may be a conventional one, is highly evacuated or filled with only inert gases without particles. A chuck (not shown) is in the chamber 10 and holds and affixes the silicon wafer 20. It is preferable that the thermal transmission between the chuck and the wafer 20 and the chuck and the chamber 10 is small. A plurality of heat sources 11 are in the upper part of the chamber 10, and a reflecting plate 12 is in the lower part of the chamber 10. Each heat source 11 can be implemented as an arc lamp, a halogen lamp, or a tungsten-halogen lamp, which emits radiation for heating the wafer 20. An array of light pipes 13 aligned with the heat sources 11 collimate the radiation from the heat sources 11 to focus the radiation onto the wafer 20 uniformly. A mask M is between the array of light pipes 13 and the wafer 20.

According to the present embodiment, the mask M blocks the radiation and shades a portion of the wafer 20. The energy of the radiation onto the wafer is absorbed by the irradiated regions of the wafer 20. The irradiated regions of the wafer 20 are heated to a temperature sufficient for rapid thermal processing. As a result, dopants implanted into these local illuminated regions of the wafer 20 selectively diffuse to form electrically active regions.

Figure 2A:
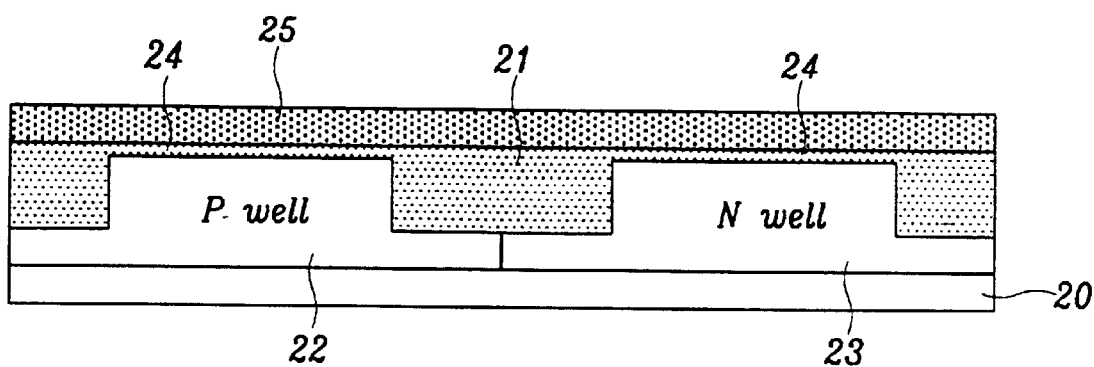
FIGS. 2A to 2D are cross-sectional views of intermediate structures of a complementary metal oxide semiconductor (CMOS) transistor according to an embodiment of the present invention.

FIGS. 2A to 2D are cross-sectional views illustrating sequential process steps that form a junction of a complementary metal oxide semiconductor (CMOS) transistor according to one embodiment of the present invention. First, as shown in FIG. 2A, a field oxide layer 21 is selectively formed on the surface area of a silicon wafer 20 by local oxidation of silicon (LOCOS) or shallow trench isolation (STI) technique, thereby defining an NMOS region and a PMOS region where an N-channel MOS transistor and a P-channel MOS transistor will be formed, respectively.

Next, a P well 22 and an N well 23 are respectively formed in the NMOS and PMOS regions of the wafer 20 by a conventional ion-implantation technique.

Subsequently, gate oxide layers 24 are formed on the exposed surfaces of the P well region 22 and the N well region 23 by a conventional thermal oxidation technique. Then, a conventional chemical vapor deposition (CVD) technique deposits a polysilicon layer 25 on the gate oxide layers 24 and the field oxide layer 21.

Figure 2B:
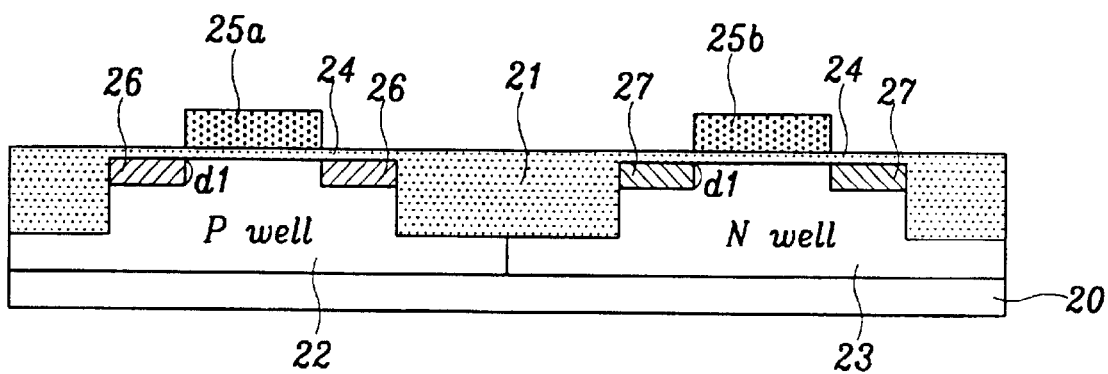

Referring to FIG. 2B, polysilicon gate electrodes 25a and 25b are formed on the gate oxide layers 24 in the P well and N well regions 22 and 23 by conventional photolithography and etching techniques. Next, an N-type region 26 and a P-type region 27 are respectively formed in the P well 22 and N well 23 by a conventional ion-implantation technique.

When the N-type region 26 is formed in the P well region 22, donor-type dopant atoms, such as phosphorus, are selectively implanted into the P well region 22 while the N well region 23 is covered with a patterned photoresist film (not shown). When the P-type region 27 is formed in the N well region 23, acceptor-type dopant atoms, such as boron, are selectively implanted into the N well region 23 while the P well region 22 is covered with a patterned photoresist film (not shown). The implant conditions such as dose, acceleration energy, etc. are controlled so that the N-type and the P-type regions 26 and 27 may have a precise depth d1 according to the desired CMOS transistor specification.

Figure 2C:
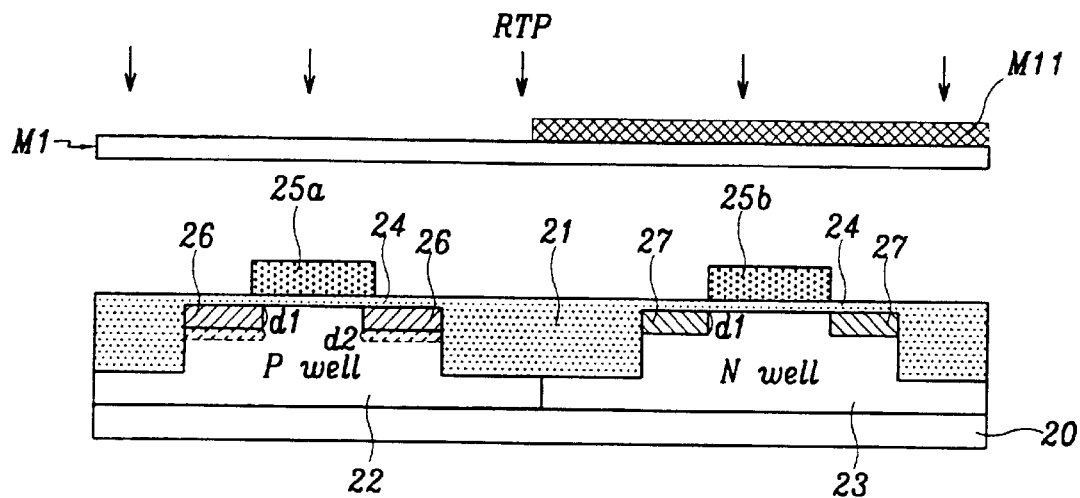

Referring to FIG. 2C, the wafer 20 is placed into the chamber 10 for RTP as shown in FIG. 1, and one of the aligners of the chamber 10 precisely adjusts the position of the wafer 20. Then, a mask M1, which has a pattern M11 for blocking the radiation from the heat source 11 to the N well 23 of the wafer 20, is positioned between the heat source 11 and the wafer 20. The other aligners adjust the position of the mask M1 so that the patterns M11 of the mask M1 conform with the N well region 23.

Next, the heat source 11 emits radiation for heating the wafer 20, and the light pipe housing 13 collimates the radiation from the heat source 11 and focuses the radiation uniformly onto the wafer 20 with the mask M1 blocking a portion of the radiation. In this manner, N-type region 26 is irradiated, while the P-type region 27 is not. The P well region 22 absorbs the energy of the radiation to heat the N-type region 26. As a result, the donor-type dopant atoms in the N-type region 26 are diffused with a diffusion depth of d2 to form an electrically active region, but the acceptor-type dopant atoms in the P-type region 27 do not diffuse.

The rapid thermal processing is controlled so that the N-type region 26 might achieve the precise junction depth of (d1+d2) according to N channel transistor specifications.

Figure 2D:
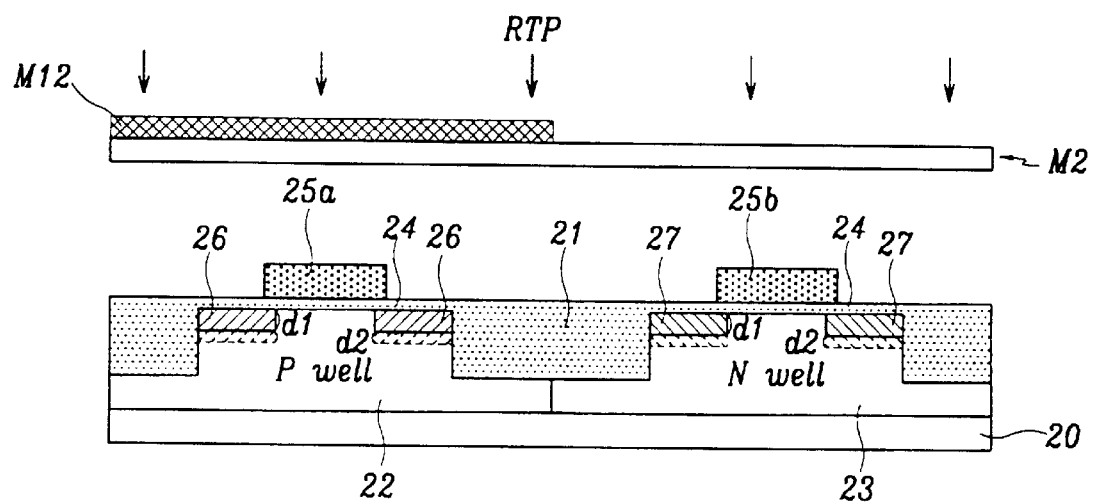

Referring to FIG. 2D, a mask M2, which has a pattern M12 for blocking the radiation from the heat source 11 to the P well 22 of the wafer 20, is used for diffusing the impurities in the P-type region 27. The RTP for the P-type region is similar to that of the N-type region 26.

The rapid thermal processing condition is controlled so that the P-type region 27 might achieve the precise junction depth of (d1+d2) according to P channel transistor specifications.

Figure 3A:
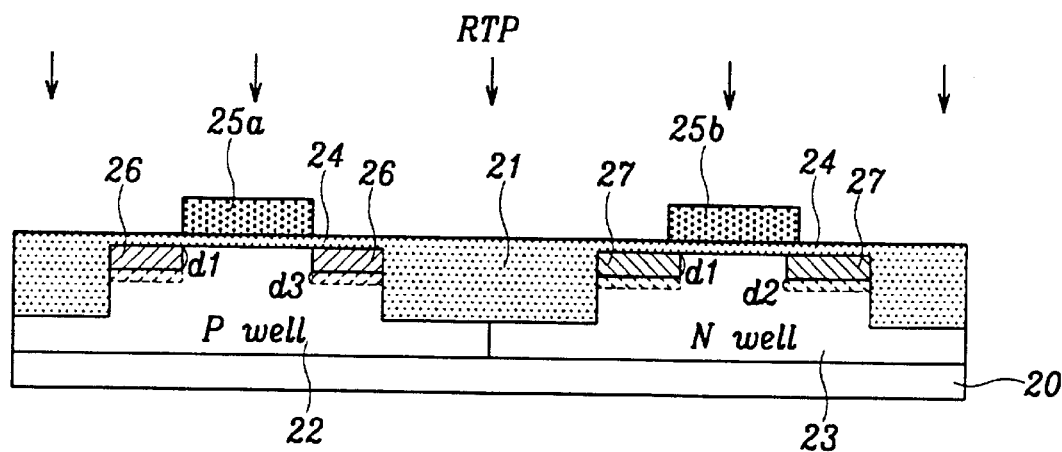
FIGS. 3A and 3B are cross-sectional views of intermediate structures of a CMOS transistor according to another embodiment of the present invention.
Figure 3B:
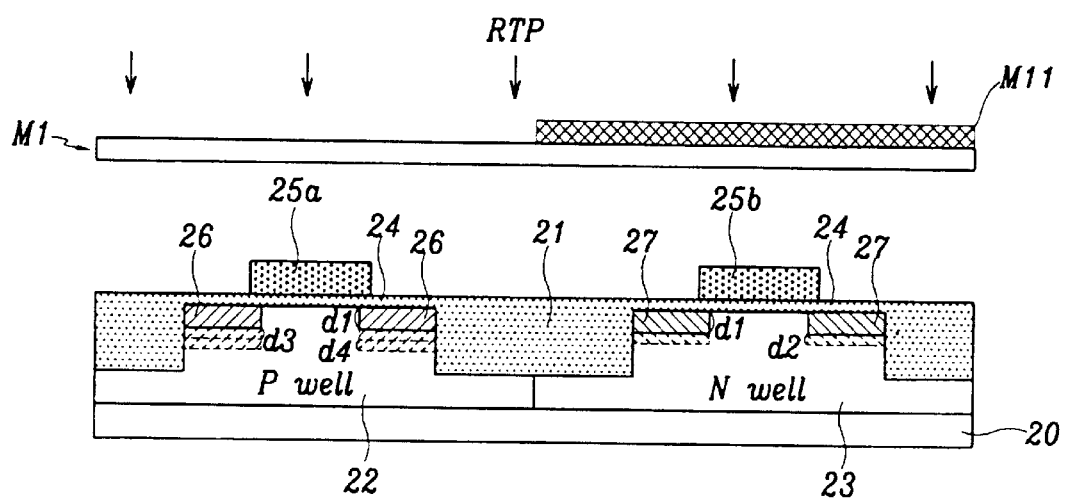

FIGS. 3A and 3B show sequential processing steps for forming a junction of a CMOS transistor according to another embodiment of the present invention. As shown previously in FIGS. 2A and 2B, a field oxide layer 21, a P well 22 and an N well 23, gate oxide layers 24, gate electrodes 25a and 25b, and an N-type region 26 and a P-type region 27 are formed in sequence on or in a silicon wafer 20.

Referring to FIG. 3A, the wafer 20 is placed into the chamber 10 for rapid thermal processing as shown in FIG. 1, and one of the aligners adjusts precisely the position of the wafer 20.

Next, an RTP is performed without masks to diffuse the impurities in the N-type and P-type regions 26 and 27. Since the two types of impurities have different diffusion rates, the diffusion depths of the regions 26 and 27 are different. The N-type region 26 has a diffusion depth d3, while the P-type region 27 has another diffusion depth d2.

Because the acceptor-type dopant atoms have higher diffusion rates than the donor-type dopant atoms, the rapid thermal processing is controlled so that the P-type region 27 might achieve the precise junction depth of (d1+d2) according to the P channel transistor specifications. However, after the first RTP, the junction depth (d1+d3) of the N-type region 26 is less than the required depth. In order to obtain the required junction depth for the N-type region 26, a subsequent rapid thermal processing using a mask M1 is performed as shown in FIG. 3B. The mask M1 has a pattern M11 which blocks the radiation from the heat source 11 to the N well 23.

The rapid thermal processing condition is controlled so that the N-type region 26 might have the precise junction depth of (d1+d3+d4) according to N channel transistor specifications, where d4 is a diffusion depth obtained in the second RTP step.

In the above described embodiments according to the present invention, a semiconductor wafer can be locally heated in rapid thermal processing. Therefore, although a semiconductor wafer has multiple regions to be formed by dopant atoms having different diffusion rates, the junction depth of each region can be precisely controlled by the diffusion of the dopant atoms by locally heating the wafer in rapid thermal processing.

While this invention has been described in connection with what is presently considered to be the most practical and preferred embodiments, it is to be understood that the invention is not limited to the disclosed embodiments, but, on the contrary, is intended to cover various modifications and equivalent arrangements included with the spirit and scope of the appended claims. The present invention is defined by the appended claims thereto.

We claim:

1. A method for heat treating a semiconductor wafer having a first region of a first impurity and a second region of a second impurity having a diffusion rate different from that of the first impurity, the method comprising:

heating only the first region of the first and second regions to diffuse the first impurity; and heating only the second region to diffuse the second impurity.

2. The method of claim 1, wherein the heating is radiation heating.

3. The method of claim 2, wherein the radiation is emitted from one of an arc lamp, a halogen lamp, or a tungsten-halogen lamp.

4. The method of claim 1, wherein the first impurity is of acceptor type, he second impurity is of donor type.

5. The method of claim 1, wherein the first impurity has a diffusion rate than the second impurity.

6. A method for heat treating a semiconductor wafer having a first region of a first impurity and a second region of a second impurity having a diffusion rate different from that of the first impurity, the method comprising:

directing radiation at the wafer;

blocking the radiation directed at the first region to prevent the first region from heating; and blocking the radiation directed at the second region to prevent the second region from heating.

7. The method of claim 6, wherein the radiation is emitted from one of an arc lamp, a halogen lamp, or a tungsten-halogen lamp.

8. The method of claim 6, wherein the blocking steps are performed with masks that have patterns aligned with the first and the second regions, respectively.

9. The method of claim 6, wherein the first impurity is of acceptor type, and the second impurity is of donor type.

10. The method of claim 6, wherein the first impurity has a diffusion rate than the second impurity.

11. A method for locally heating a semiconductor wafer having a first region of a first impurity and a second region of a second impurity having a diffusion rate different from that of the first impurity, the method comprising:

directing a first dose of radiation at the wafer to heat the first and the second regions;

directing a second dose of radiation at the wafer; and blocking a part of the second dose of radiation directed at the first region to thereby prevent the first impurity from diffusing.

12. The method of claim 11, wherein the first dose of radiation and the second dose of radiation are emitted from one of an arc lamp, a halogen lamp, or a tungsten-halogen lamp.

13. The method of claim 11, wherein the blocking is performed with a mask that has a pattern aligned with the first region.

14. The method of claim 11, wherein the first impurity has a diffusion rate faster than the second impurity.

15. The method of claim 14, wherein the first impurity is of acceptor type, and the second impurity is of donor type.

16. A method for heat treating a semiconductor wafer having a first region of a first impurity and a second region of a second impurity having a diffusion rate different from that of the first impurity, the method comprising:

heating at least the first region to diffuse at least the first impurity; and heating only the second region to diffuse the second impurity;

wherein in heating at least the first region, the first and second regions are heated to diffuse the first and the second impurities.

17. The method of claim 16, wherein the heating is radiation heating.

18. The method of claim 17, wherein the radiation is emitted from one of an arc lamp, a halogen lamp, or a tungsten-halogen lamp.

19. The method of claim 16, wherein the first impurity is of acceptor type, and the second impurity is of donor type.

* * * * *